(12) United States Patent
Lee

(10) Patent No.: US 9,400,290 B2
(45) Date of Patent: Jul. 26, 2016

(54) TORQUE INDEX SENSOR

(71) Applicant: LG INNOTEK CO., LTD., Seoul (KR)

(72) Inventor: Chang Hwan Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/496,720

(22) Filed: Sep. 25, 2014

(65) Prior Publication Data

US 2015/0090051 A1 Apr. 2, 2015

(30) Foreign Application Priority Data

Sep. 27, 2013 (KR) .......................... 10-2013-0115019

(51) Int. Cl.
*G01L 3/02* (2006.01)
*G01R 1/18* (2006.01)
*G01L 3/10* (2006.01)
*G01L 3/14* (2006.01)

(52) U.S. Cl.
CPC . *G01R 1/18* (2013.01); *G01L 3/104* (2013.01); *G01L 3/1435* (2013.01)

(58) Field of Classification Search
CPC ......... G01L 3/104; G01L 3/1435; G01R 1/18
USPC ....................... 73/862.191, 862.331–862.335
See application file for complete search history.

(56) References Cited

U.S. PATENT DOCUMENTS

| | | | | |
|---|---|---|---|---|
| 6,268,722 B1 * | 7/2001 | Kogure | ................. | G01D 5/145 |
| | | | | 324/207.12 |
| 2013/0167660 A1 | 7/2013 | Antoni et al. | | |
| 2013/0220030 A1 * | 8/2013 | Nishikawa | ............. | G01L 3/101 |
| | | | | 73/862.331 |
| 2013/0312539 A1 * | 11/2013 | Shimomura | ........... | G01L 3/101 |
| | | | | 73/862.325 |
| 2014/0283623 A1 * | 9/2014 | Song | ....................... | B62D 6/10 |
| | | | | 73/862.193 |

FOREIGN PATENT DOCUMENTS

WO WO-2012/015183 A2 2/2012

OTHER PUBLICATIONS

European Search Report dated Mar. 18, 2015 in European Application No. 14186507.1.

* cited by examiner

*Primary Examiner* — Max Noori
(74) *Attorney, Agent, or Firm* — Saliwanchik, Lloyd & Eisenschenk

(57) ABSTRACT

A torque index sensor according to an embodiment of the present invention includes a rotor rotating with the first shaft which is one of an input shaft and an output shaft having a first magnet on an outer circumferential surface thereof, a stator disposed on an outer side of the first magnet and rotating with the second shaft which is the other of the input shaft and the output shaft, a shield disposed on a lower side of the stator and rotating with the second shaft and a second magnet combined with a lower side of the shield and rotating with the second shaft. The torque index sensor shields magnetic field interference and improves operational reliability.

9 Claims, 8 Drawing Sheets

(a)

(b)

TORQUE INDEX SENSOR

CROSS-REFERENCES TO RELATED APPLICATION

This application claims the benefit under 35 U.S.C. §119 of Korean Patent Application No. 10-2013-0115019, filed Sep. 27, 2013, which is hereby incorporated by reference in its entirety.

BACKGROUND

1. Technical Field

The present invention relates to a torque index sensor. More specifically, the present invention relates to a torque index sensor having improved operational reliability by shielding magnetic field interference between a torque sensor and an index sensor.

2. Related Art

Generally, an electronic power steering (EPS) system is an apparatus for ensuring steering stability of a vehicle, which assists a driver to steer and eases handling by providing a torque in a direction of steering by a driver using a motor.

Such an EPS system may control motor operations according to driving conditions to improve steering performance and steering comfort, unlike the conventional hydraulic power steering (HPS) system.

A torque, steering angle, and steering angle velocity applied to a steering shaft may be measured in order for an EPS system to provide an appropriate torque.

A normal steering structure includes an input shaft combined with a steering wheel, an output shaft combined with a pinion meshed with a rack bar of a wheel side, and a torsion bar connecting the input shaft to the output shaft.

When the steering wheel rotates, a rotational force is transmitted to the output shaft, and a direction of a wheel is changed by functions of the pinion and the rack bar. At this time, when a large amount of resistance is applied, the input shaft rotates more to twist the torsion bar. Here, a magnetic torque sensor measures a degree of twist of the torsion bar.

In addition, an index sensor measures a rotational angular velocity or angular acceleration by detecting rotation of a magnet rotating with the output shaft. Normally, the above-described torque sensor and index sensor may be combined and integrally configured. This is referred to as a torque index sensor.

Such a torque index sensor is simple and economic. However, since the two types of magnetic detecting devices are disposed adjacent to each other, magnetic field interference may occur.

Likewise, if the magnetic field interference between the torque sensor and the index sensor occurs, errors in values measured by the sensors may occur, and thus overall operational reliability may be degraded.

BRIEF SUMMARY

The present invention is directed to a torque index sensor capable of improving operational reliability by shielding magnetic field interference generated between a torque sensor and an index sensor.

According to an aspect of the present invention, there is provided a torque index sensor including a rotor rotating with the first shaft which is one of an input shaft and an output shaft having a first magnet on an outer circumferential surface thereof, a stator disposed on an outer side of the first magnet and rotating with the second shaft which is the other of the input shaft and the output shaft, a shield disposed on a lower side of the stator and rotating with the second shaft, and a second magnet combined with a lower side of the shield and rotating with the second shaft.

The shield may include a ring-shaped shielding member having a lower side combined with the second magnet, and a support protruding from a lower side of the shielding member and supporting the second magnet.

An outer diameter of the shielding member may be equal to or greater than that of a circle formed by the second magnet.

The shielding member may have a thickness of 0.2 mm or more.

The shielding member may extend to at least one of an inner diameter side or an outer diameter side of the second magnet.

The support may include a first supporting hook having a ring shape and supporting the inner diameter side of the second magnet, and at least one second hook protruding from the first supporting hook to support at least one of both sides of the second magnet.

The torque index sensor may further include a fixing unit disposed on the shielding member and combined with the stator.

The fixing unit may include at least one coupling protrusion fixedly inserted into a coupling groove formed on a lower side of the stator.

According to another aspect of the present invention, there is provided a torque index sensor including a rotor rotating with an input shaft and having a first magnet on an outer circumferential surface thereof, a tooth disposed to be spaced apart from an outer side of the first magnet, a molding member inserted into the tooth to fix the tooth, having a lower side combined with an outer circumferential surface of a holder, and having a ring-shaped groove formed on a lower surface thereof, and a second magnet disposed in the groove. A ring-shaped shielding member may be disposed between the groove and an upper surface of the second magnet.

The shielding member may extend between the groove and an outer diameter side of the second magnet.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION

Exemplary embodiments of the present invention will be described in detail below with reference to the accompanying drawings. However, exemplary embodiments of the present invention may be embodied in many alternate forms and should not be construed as limited to the exemplary embodiments of the present invention set forth herein.

It will be understood that, although the terms first, second, etc. may be used herein to describe various elements, components and/or sections, these elements, components and/or sections should not be limited by these terms. These terms are only used to distinguish one element, component, or section from another. Therefore, a first element, a first component, or a first section could be termed a second element, a second component or a second section within the scope of the invention.

It will be understood that when an element or layer is referred to as being "connected to" or "coupled to" another element or layer, it can be directly connected or coupled to the other element or layer or intervening elements or layers may be present. In contrast, when an element is referred to as "directly connected to" or "directly coupled to" another element or layer, there are no intervening elements or layers present. The term "and/or" includes any and all combinations of one or more referents.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
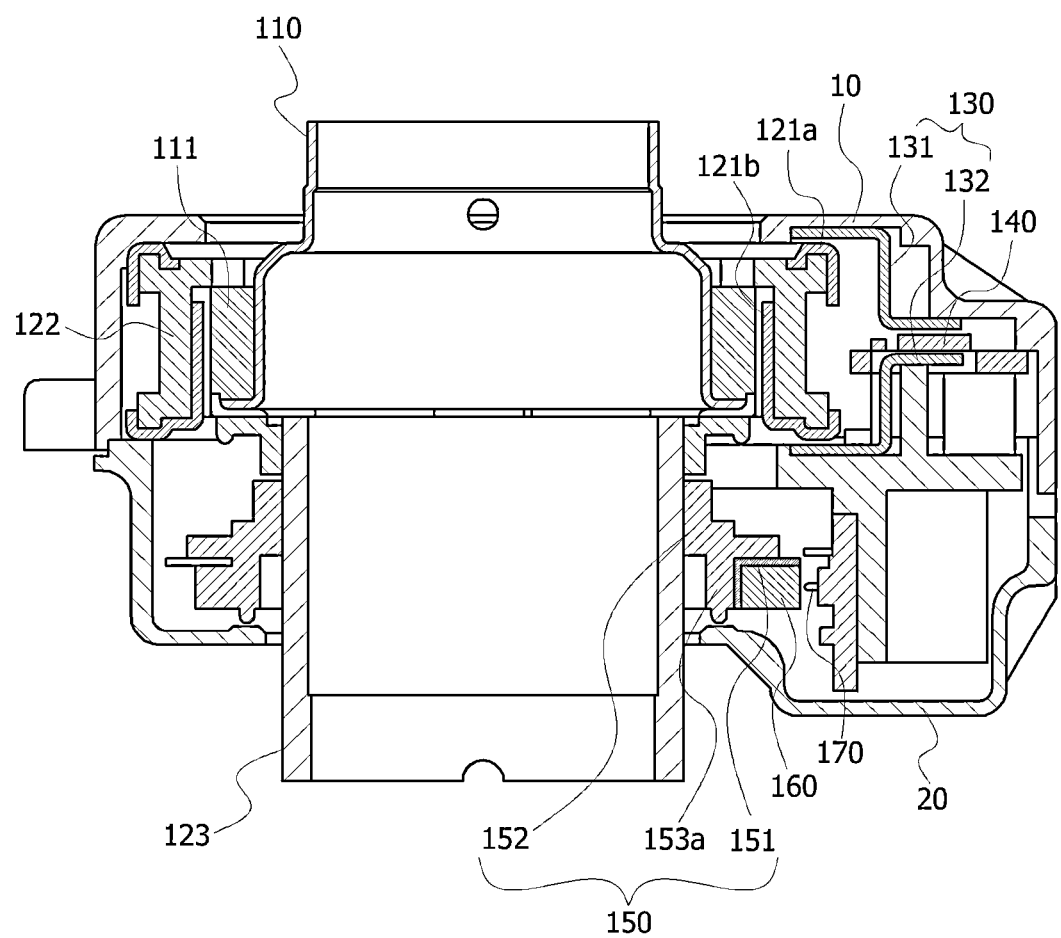
FIG. 1 is a side sectional view showing a torque index sensor according to an embodiment of the present invention.
Figure 2:
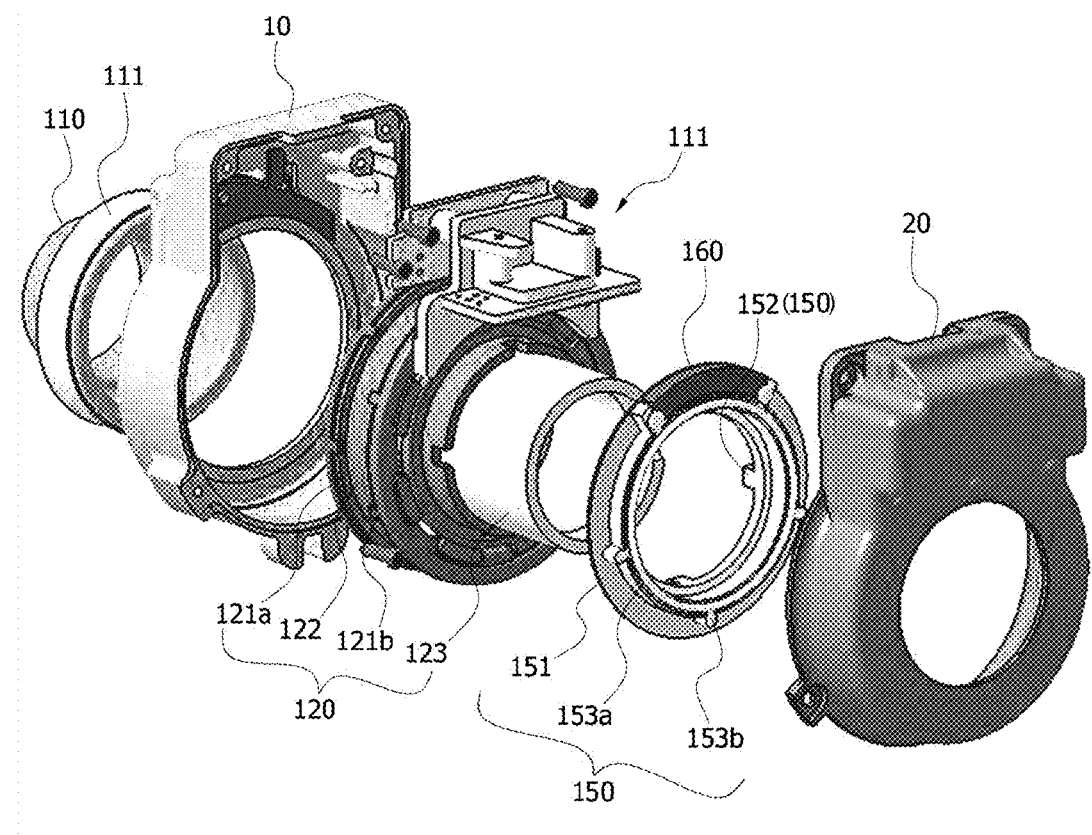
FIG. 2 is an exploded perspective view showing a torque index sensor, seen from a top side, according to an embodiment of the present invention.
Figure 3:
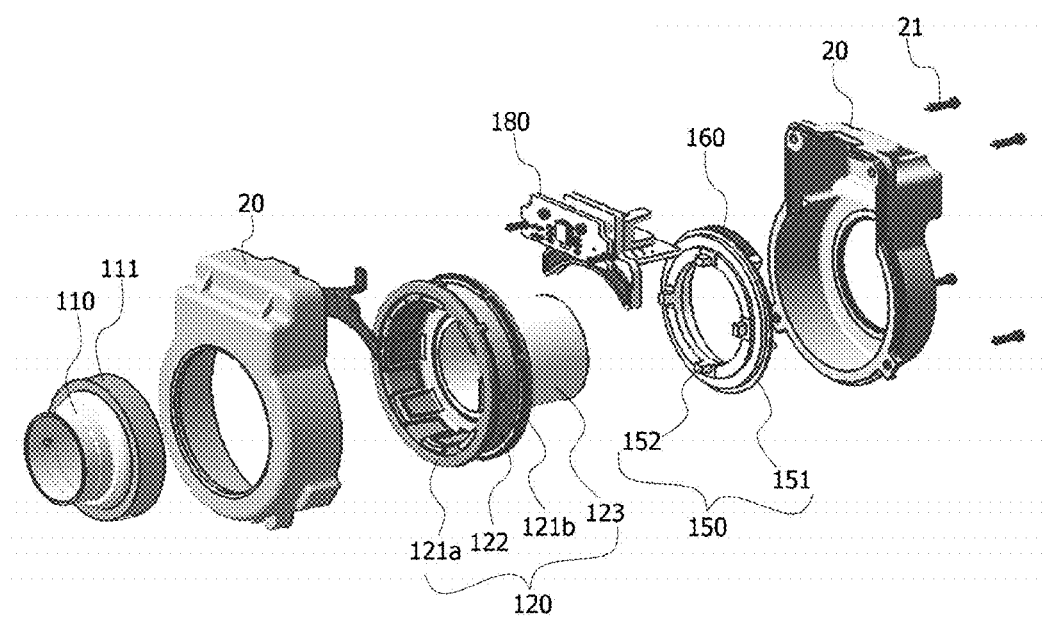
FIG. 3 is an exploded perspective view showing a torque index sensor, seen from a bottom side, according to an embodiment of the present invention.

FIG. 1 is a side sectional view showing a torque index sensor according to an embodiment of the present invention. FIG. 2 is an exploded perspective view showing a torque index sensor, seen from a top side, according to an embodiment of the present invention. FIG. 3 is an exploded perspective view showing a torque index sensor, seen from a bottom side, according to an embodiment of the present invention.

Referring to FIGS. 1 to 3, a torque index sensor according to an embodiment of the present invention, whose configuration is formed by an upper case 10 and a lower case 20, includes a rotor 110, a first magnet 111, a stator 120, a collector 130, a first magnetic device 140, a shield 150, a second magnet 160, a second magnetic device 170, and a circuit board 180.

Here, the first magnet 111 and the first magnetic device 140 respectively represent a magnet and a magnetic device which are used in a torque sensor, and the second magnet 160 and the second magnetic device 170 respectively represent a magnet and a magnetic device which are used in an index sensor.

The rotor 110 is connected to an input shaft (not shown) to rotate with the input shaft, and a ring-shaped first magnet 111 is disposed on an outer circumferential surface of the rotor 110.

The stator 120 includes a first tooth 121a, a second tooth 121b, a molding member 122, and a holder 123.

The first tooth 121a and the second tooth 121b are disposed to be spaced apart from each other on an outer side of the first magnet 111 and respectively fixed to an upper side and a lower side of the molding member 122. Each of the first tooth 121a and the second tooth 121b includes a plurality of protruding portions formed to bend in an axial direction, and the protruding portions are disposed opposite the first magnet 111 disposed on the outer circumferential surface of the rotor 110.

The holder 123 connected to an output shaft (not shown) is combined with the lower side of the molding member 122. Accordingly, the stator 120 is connected to the output shaft to rotate with the output shaft.

When a torsion bar is twisted by a difference in the amount of rotation between the input shaft and the output shaft, the amount of rotation of the first magnet 111 and the stator 120 attached to the rotor 110 may be changed, which results in a change of opposing surfaces of the first magnet 111 and the protruding portions of the first tooth 121a and the second tooth 121b. Accordingly, torque may be measured by detecting a change of the amount of magnetization of the stator 120.

For this, the collector 130 is combined with one side of the first tooth 121a and the second tooth 121b to collect magnetic flux. The collector 130 includes a first collector 131 combined with an upper side of the first tooth 121a, and a second collector 132 combined with a lower side of the second tooth 121b.

The first magnetic device 140 may be disposed between the first collector 131 and the second collector 132 to detect the amount of magnetization of the stator 120. The first magnetic device 140 is electrically in contact with the first collector 131 and the second collector 132 and detects the amount of magnetization of the stator 120 magnetized by a magnetic interaction between the first magnet 111 and the protruding portions of the first tooth 121a and the second tooth 121b. The first magnetic device 140 may be a Hall IC which can detect the strength of a magnetic field.

An index sensor including the second magnet 160 and the second magnetic device 170 is disposed on a lower side of the stator 120.

The second magnet 160 is connected to the output shaft together with the stator 120 and rotates with the output shaft. The second magnet 160 has an arc shape with a predetermined length in a circumferential direction unlike the first magnet 111.

The second magnetic device 170 is disposed at an outer side of the second magnet 160, and repeats a process of being adjacent to and receding away from the second magnet 160 according to the rotation of the output shaft.

The second magnetic device 170 may output a detection signal whenever it becomes adjacent to the second magnet 160, that is, in a period of 360°. Based on the detection signal, an angular velocity and angular acceleration of rotation may be calculated.

However, when the second magnet 160 is disposed to be adjacent to the stator 120, a magnetic field may affect the stator 120 and the collector 130 and generate magnetic field interference.

According to the embodiment of the present invention, a ring-shaped shield 150 is disposed between the stator 120 and the second magnet 160, and the second magnet 160 is combined with the shield 150 to rotate with the output shaft.

Figure 4:
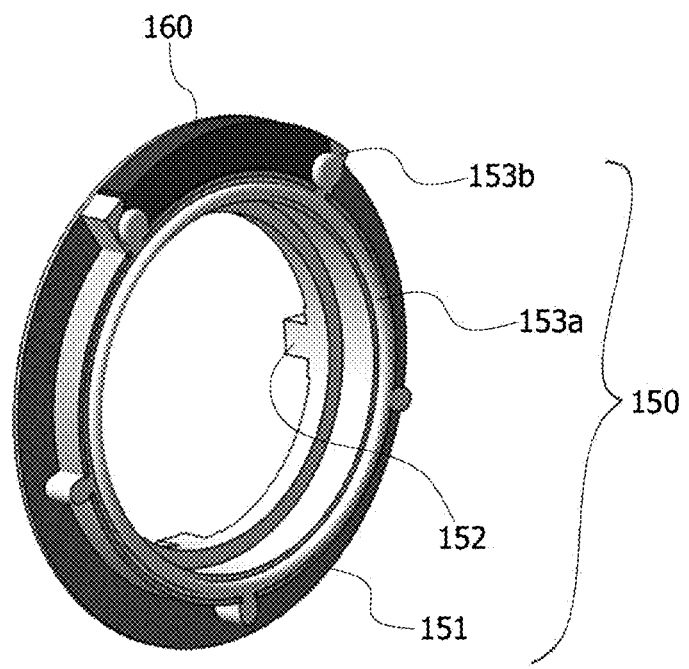
FIG. 4 is a perspective view showing a shield of a torque index sensor according to an embodiment of the present invention.
Figure 5:
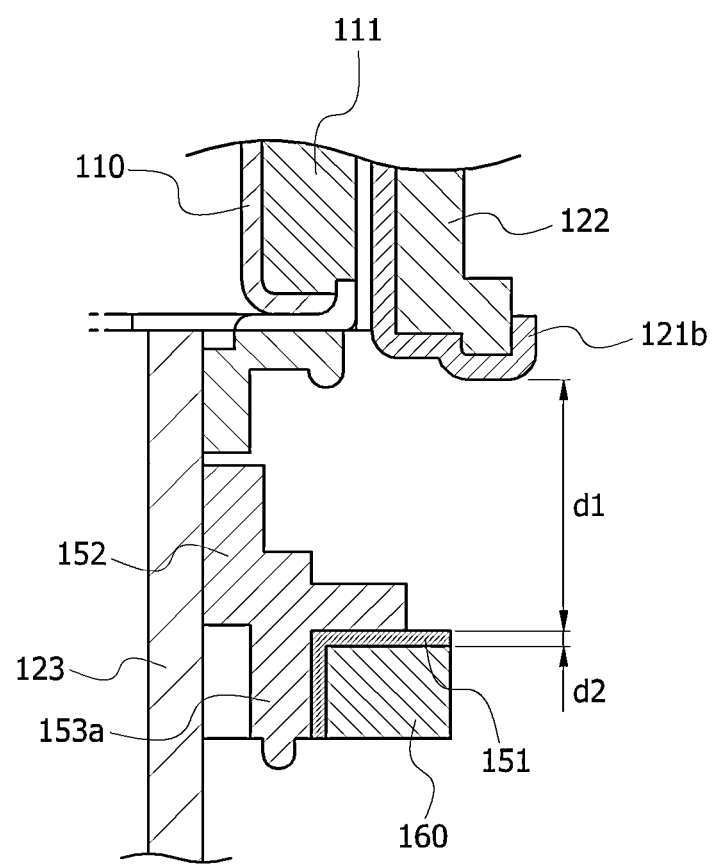
FIG. 5 is a view illustrating a distance between a shielding member and a stator, and a thickness of the shielding member in a torque index sensor according to an embodiment of the present invention.
Figure 6:
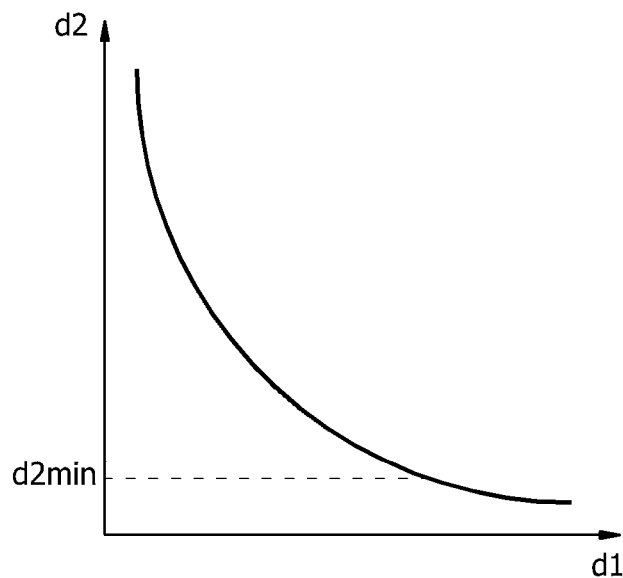
FIG. 6 is a graph illustrating a relationship between the distance between the shielding member and stator and the thickness of the shielding member illustrated in FIG. 5, and a relationship between flux of a second magnet and the thickness of the shielding member.
Figure 6:
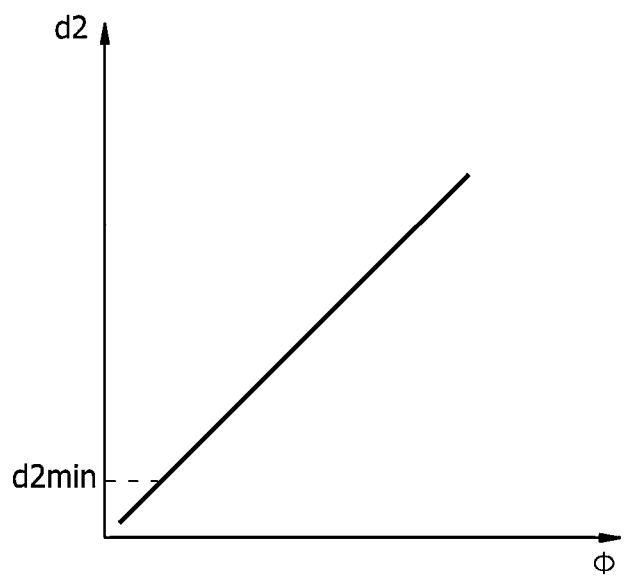

FIG. 4 is a perspective view showing a shield of a torque index sensor according to an embodiment of the present invention. FIG. 5 is a view illustrating a distance between a shielding member and stator and a thickness of the shielding member in a torque index sensor according to an embodiment of the present invention. FIG. 6 is a graph illustrating a relationship between the distance between the shielding member and stator and the thickness of the shielding member illustrated in FIG. 5, and a relationship between flux of a second magnet and the thickness of the shielding member.

Referring to FIGS. 1 to 4, the shield 150 may include a shielding member 151, a fixing unit 152, and a supporting unit 153, and the supporting unit 153 may include a first supporting hook 153a and a second supporting hook 153b.

The shielding member 151 may have a ring shape, and the second magnet 160 is combined with a lower side of the shielding member 151. Accordingly, magnetic field interference between the stator 120 and the second magnet 160 is shielded by the shielding member 151. A material of the shielding member 151 may be preferably a ferromagnetic material having high permeability, and an outer diameter of the shielding member 151 may be preferably equal to or more than an outer diameter of a circle formed by the second magnet 160 for effective shielding.

Referring to FIG. 1, the shielding member 151 combined with an upper side of the second magnet 160 may extend toward an inner diameter side of the second magnet 160. That is, the shielding member 151 may have an L-shape combined with the upper side and the inner diameter side of the second magnet 160.

The shielding member 151 and the second magnet 160 may be fixed by an insert mold. On the other hand, the shielding member 151 and the second magnet 160 may be fixed by adhesion.

Meanwhile, referring to FIG. 6, a thickness d2 of the shielding member 151 is proportional to flux φ emitted by the second magnet 160, and inversely proportional to a distance d1 between the stator 120 and the shielding member 151.

Accordingly, the thickness d2 of the shielding member 151 shielding the magnetic field interference may be determined based on the distance d1 between the stator 120 and the shielding member 151, and the flux φ emitted by the second magnet 160 as shown in the following Equation 1.

Here, the thickness d2 of the shielding member 151 may be preferably at least 0.2 mm in order to ensure the minimum rigidity.

$$d_2 = A \frac{\phi}{d_1}$$ [Equation 1]

Here, A represents a constant experimentally derived according to a permeability of the shielding member 151 and material characteristics of the second magnet 160.

The fixing unit 152 is disposed on an upper side of the shielding member 151 and a lower side of the molding member 122 of the stator 120. As the fixing unit 152 is combined with the stator 120, the second magnet 160 combined with the shielding member 151 is rotated with the output shaft.

Referring to FIGS. 3 and 4, the fixing unit 152 may include one or more coupling protrusions fixedly inserted into coupling grooves formed in the lower side of the molding member 122.

The supporting unit 153 includes a ring-shaped first supporting hook 153a protruding toward the inner diameter side of the second magnet 160 to support the inner diameter side of the second magnet 160, and at least one second supporting hook 153b protruding from the first supporting hook 153a toward an outer diameter side to support at least one of the inner and outer diameter sides of the second magnet 160.

The second magnet 160 rotating with the output shaft may be stably supported by the first supporting hook 153a and the second supporting hook 153b.

Meanwhile, the fixing unit 152 and the supporting unit 153 may be integrally formed, or independently formed and then combined.

According to the embodiment of the present invention, the ring-shaped shield 150 is disposed between the second magnet 160 and the stator 120, and the second magnet 160 is combined with the shield 150 to rotate with the shield 150. Accordingly, magnetic field interference may be shielded regardless of the rotational position of the second magnet 160.

Figure 7:
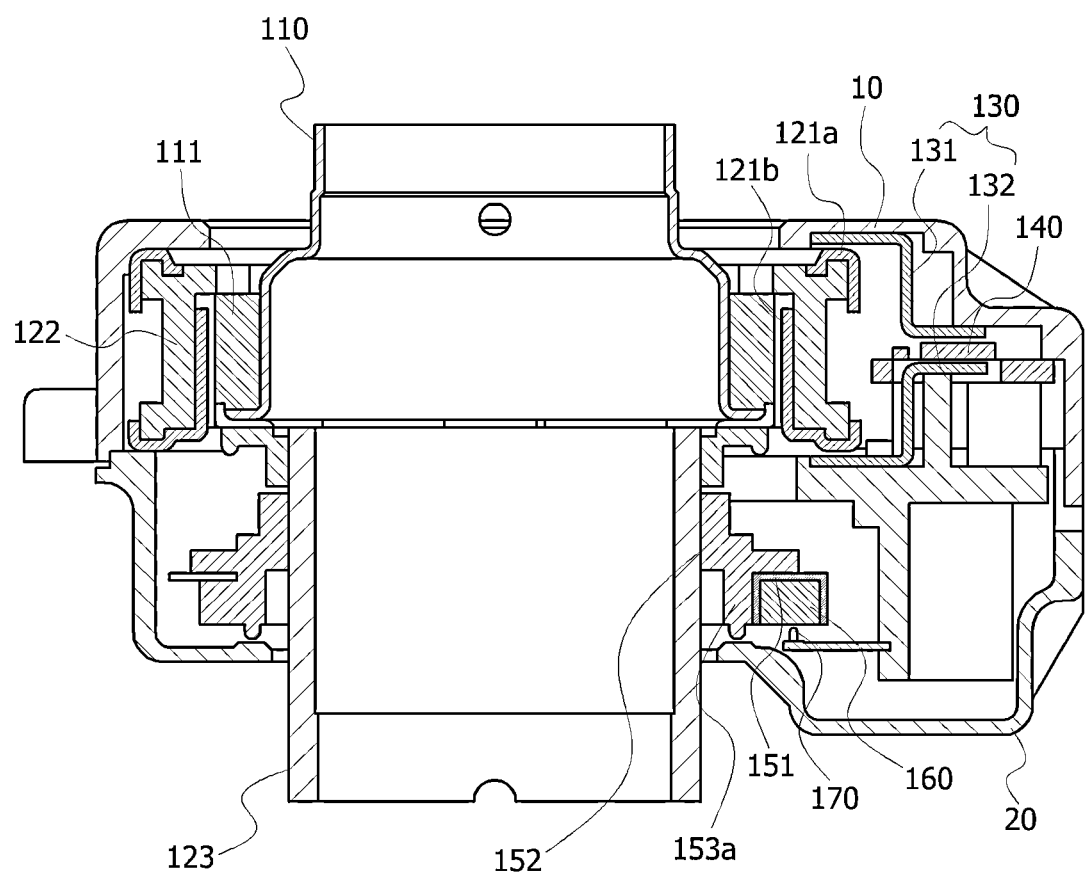
FIG. 7 is a side sectional view showing a torque index sensor according to another embodiment of the present invention.

FIG. 7 is a side sectional view showing a torque index sensor according to another embodiment of the present invention.

Referring to FIG. 7, a shielding member 151 of the torque index sensor according to the embodiment of the inventive concept may extend toward an outer diameter side of a second magnet 160. That is, the shielding member 151 may be combined with an upper side, an inner diameter side, and the outer diameter side of the second magnet 160 in a U-shape.

In this case, since the outer diameter side of the second magnet 160 is shielded by the shielding member 151, a second magnetic device 170 detecting rotation of the second magnet 160 may be disposed on the lower side of the second magnet 160.

According to the embodiment of the inventive concept, since the shielding member 151 shields to the outer diameter side, a shielding effect may be improved.

Figure 8:
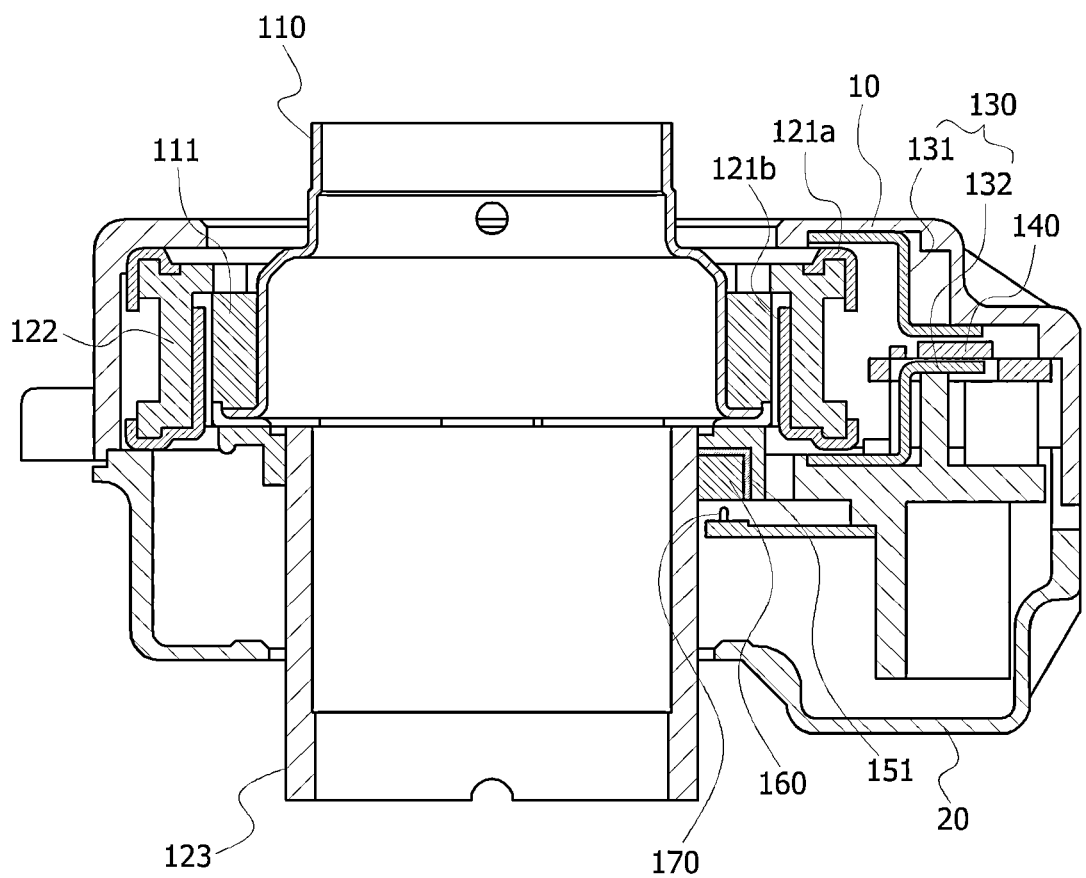
FIG. 8 is a side sectional view showing a torque index sensor according to still another embodiment of the present invention.

FIG. 8 is a side sectional view showing a torque index sensor according to still another embodiment of the present invention.

In the above-described embodiments, the second magnet 160 is combined with the shield 150, the shield 150 is combined with the molding member 122 of the stator 120, and the second magnet 160 and the shield 150 rotate with the output shaft. However, the second magnet 160 may be directly fixed to a lower side of the molding member 122 through a shielding member 151.

That is, as shown in FIG. 8, a ring-shaped groove is formed on a lower side of a molding member 122 combined with an outer circumferential surface of a holder 123, the second magnet 160 is disposed in the groove, and the shielding member 151 is interposed between an upper side of the second magnet 160 and the groove. Here, the shielding member 151 may extend between an outer diameter side of the second magnet 160 and the groove.

In this case, the molding member 122 may have a greater outer diameter than those in the above-described embodiments so that the groove is formed. In addition, since the outer diameter side of the second magnet 160 is shielded by the shielding member 151 and the molding member 122, a second magnetic device 170 detecting rotation of the second magnet 160 may be disposed on a lower side of the second magnet 160.

According to the embodiment of the present invention, the molding member 122 or the holder 123 may replace a fixing unit 152 fixing the shield 150 to the molding member 122 of the stator 120 and a supporting unit 153 supporting the second magnet 160. Accordingly, as an advantage, the overall height of the torque index sensor may be reduced. In addition, since the second magnet 160 is directly combined with the holder 123 through the molding member 122, the rotation of the output shaft may be accurately detected.

Meanwhile, it is described as an example in the above-described embodiments that the rotor 110 is connected to the input shaft to rotate with the input shaft, and the stator 120, the shield 150, and the second magnet 160 are connected to the output shaft to rotate with the output shaft. However, this embodiment may be applied to a configuration opposite to such a configuration. That is, the rotor 110 may be connected to the output shaft, and the stator 120, the shield 150, and the second magnet 160 may be connected to the input shaft.

According to the embodiments of the present invention, magnetic field interference between a torque sensor and an index sensor may be shielded by disposing a ring-shaped shield between an index sensor magnet and a stator.

In addition, according to the embodiments of the present invention, since the index sensor magnet is combined and rotated with the shield, magnetic field interference may be shielded regardless of a rotational position of the index sensor magnet.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A torque index sensor, comprising:
   a rotor rotating with a first shaft which is one of an input shaft and an output shaft having a first magnet on an outer circumferential surface thereof;
   a stator disposed on an outer side of the first magnet and rotating with a second shaft which is the other of the input shaft and the output shaft;
   a shield disposed on a lower side of the stator and rotating with the second shaft; and
   a second magnet combined with a lower side of the shield and rotating with the second shaft;
   wherein the shield comprises:
   a ring-shaped shielding member having a lower side combined with the second magnet; and
   a support protruding from the lower side of the shielding member and supporting the second magnet; and
   wherein the ring-shaped shielding member is disposed on an upper surface of the second magnet and a lateral side surface of the second magnet.

2. The torque index sensor of claim 1, wherein an outer diameter of the shielding member is equal to or greater than that of a circle formed by the second magnet.

3. The torque index sensor of claim 1, wherein the shielding member has a thickness of 0.2 mm or more.

4. The torque index sensor of claim 1, wherein the support comprises:
   a first supporting hook having a ring shape and supporting an inner diameter side of the second magnet; and
   at least one second hook protruding from the first supporting hook to support at least one of both sides of the second magnet.

5. The torque index sensor of claim 1, further comprising a fixing unit disposed on the shielding member and combined with the stator.

6. The torque index sensor of claim 5, wherein the fixing unit includes at least one coupling protrusion fixedly inserted into a coupling groove formed on a lower side of the stator.

7. A torque index sensor, comprising:
   a rotor rotating with a first shaft which is one of an input shaft and an output shaft and having a first magnet on an outer circumferential surface thereof; and
   a stator rotating with a second shaft which is the other of the input shaft and the output shaft;
   wherein the stator comprises a holder connected to the second shaft, a tooth, and a molding member inserted into the tooth;
   wherein the tooth is disposed to be spaced apart from an outer side of the first magnet;
   wherein the molding member is inserted into the tooth to fix the tooth, has a lower side combined with an outer circumferential surface of the holder, and has a ring-shaped groove formed on a lower surface thereof;
   wherein a second magnet is disposed in the groove; and
   wherein a ring-shaped shielding member is disposed between the groove and an upper surface of the second magnet.

8. The torque index sensor of claim 7, wherein the shielding member extends between the groove and an outer diameter side of the second magnet.

9. The torque index sensor of claim 7, wherein the second magnet is in direct physical contact with the holder.

\* \* \* \* \*